United States Patent
Iwata et al.

(10) Patent No.: US 9,362,242 B2
(45) Date of Patent: Jun. 7, 2016

(54) BONDING STRUCTURE INCLUDING METAL NANO PARTICLE

(71) Applicant: Mitsubishi Electric Corporation, Tokyo (JP)

(72) Inventors: Aya Iwata, Tokyo (JP); Yasunari Hino, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/247,272

(22) Filed: Apr. 8, 2014

(65) Prior Publication Data
US 2015/0041827 A1    Feb. 12, 2015

(30) Foreign Application Priority Data
Aug. 8, 2013    (JP) .................................. 2013-164777

(51) Int. Cl.
*H01L 23/00*    (2006.01)
*H01L 29/16*    (2006.01)
(Continued)

(52) U.S. Cl.
CPC .............. *H01L 24/05* (2013.01); *H01L 23/367* (2013.01); *H01L 23/4827* (2013.01); *H01L 24/03* (2013.01); *H01L 24/83* (2013.01); *H01L 29/1608* (2013.01); *H01L 23/3735* (2013.01); *H01L 23/3736* (2013.01); *H01L 24/29* (2013.01); *H01L 24/32* (2013.01); *H01L 2224/0383* (2013.01); *H01L 2224/04026* (2013.01); *H01L 2224/05023* (2013.01); *H01L 2224/05144* (2013.01); *H01L 2224/05155* (2013.01); *H01L 2224/05552* (2013.01); *H01L 2224/05557* (2013.01); *H01L 2224/05568* (2013.01);
(Continued)

(58) Field of Classification Search
CPC ................... H01L 23/3735; H01L 2224/8384; H01L 2251/5369
See application file for complete search history.

(56) References Cited

U.S. PATENT DOCUMENTS

| | | | |
|---|---|---|---|
| 8,840,811 B2 * | 9/2014 | Yasuda et al. ................. | 252/500 |
| 2004/0134875 A1 * | 7/2004 | Fukami ............... | H01L 21/4857 216/13 |

(Continued)

FOREIGN PATENT DOCUMENTS

| | | |
|---|---|---|
| JP | 2004-107728 A | 4/2004 |
| JP | 2006-202586 A | 8/2006 |

OTHER PUBLICATIONS

Eiichi Ide, Shinji Angata, Akio Hirose, and Kojiro F. Kobayashi, "The Novel Bonding Process Using Ag Nanoparticles—Investigation on Bondability to Cu–", 10th Symposium on "Microjoining and Assembly Technology in Electronics", Feb. 5-6, 2004, pp. 213-218.

(Continued)

*Primary Examiner* — Ida M Soward
(74) *Attorney, Agent, or Firm* — Studebaker & Brackett PC

(57) ABSTRACT

A bonding structure including metal nano particles includes a first member having a metal surface on at least one side, a second member having a metal surface on at least one side, the second member being disposed such that the metal surface of the second member faces the metal surface of the first member, and a bonding material bonding the first member and the second member by sinter-bonding the metal nano particles. At least one of the metal surfaces of the first member and the second member is formed to be a rough surface having a surface roughness within the range from 0.5 μm to 2.0 μm.

8 Claims, 4 Drawing Sheets

(51) Int. Cl.
*H01L 23/482* (2006.01)
*H01L 23/367* (2006.01)
*H01L 23/373* (2006.01)

(52) U.S. Cl.
CPC .......... *H01L2224/05583* (2013.01); *H01L 2224/05644* (2013.01); *H01L 2224/2732* (2013.01); *H01L 2224/2929* (2013.01); *H01L 2224/29298* (2013.01); *H01L 2224/29339* (2013.01); *H01L 2224/32245* (2013.01); *H01L 2224/83* (2013.01); *H01L 2224/8384* (2013.01); *H01L 2224/83192* (2013.01); *H01L 2224/83203* (2013.01); *H01L 2224/83365* (2013.01); *H01L 2224/83385* (2013.01); *H01L 2251/5369* (2013.01)

(56) References Cited

U.S. PATENT DOCUMENTS

| | | | |
|---|---|---|---|
| 2004/0245648 A1* | 12/2004 | Nagasawa et al. | 257/772 |
| 2005/0082554 A1* | 4/2005 | Torvik | B82Y 20/00 257/885 |
| 2008/0145607 A1* | 6/2008 | Kajiwara et al. | 428/137 |
| 2009/0242871 A1* | 10/2009 | Kobayashi | C09K 11/025 257/13 |
| 2011/0114708 A1* | 5/2011 | Maeda et al. | 228/248.1 |
| 2013/0003181 A1* | 1/2013 | Hayashibe et al. | 359/585 |
| 2013/0092223 A1* | 4/2013 | Rampley et al. | 136/256 |
| 2013/0199828 A1* | 8/2013 | Nakabayashi | H05K 3/38 174/257 |
| 2013/0298393 A1* | 11/2013 | Abbott | 29/827 |
| 2013/0335921 A1* | 12/2013 | Nagatomo et al. | 361/709 |
| 2014/0147986 A1* | 5/2014 | Dang et al. | 438/458 |
| 2016/0087139 A1* | 3/2016 | Ivanov | H01L 31/101 257/461 |

OTHER PUBLICATIONS

Ph. Buffat and J-P Borel, "Size Effect on the Melting Temperature of Gold Particles" Phys. Rev. A 13(6) 2287-2298 (1976).

\* cited by examiner

BONDING STRUCTURE INCLUDING METAL NANO PARTICLE

BACKGROUND OF THE INVENTION

1. Field of the Invention

The present invention relates to a technique for bonding two members by using micro metal particles (metal nano particles).

2. Description of the Background Art

As a conventional bonding method, particularly, a method for bonding a semiconductor to an insulating substrate, a soldering material has been used. However, a soldering material has a low heat resistance and decreases reliability in a temperature of around 200° C.

Thus, as described in Japanese Patent Application Laid-Open No. 2004-107728, a technique for bonding two members by applying heat to metal nano particles instead of a soldering material is proposed. In this bonding method, composite metal nano particles in which metal particles having an average diameter of approximately 100 nm or less are bound and coated by an organic matter are a main component of a bonding material. In the bonding method for bonding two members, a metal nanopaste, in which the composite metal nano particles are dispersed in an organic solvent, is interposed between bonding parts of the two members which are at least heated to vaporize an organic component.

A silver nanopaste including silver nano particles coated with an organic solvent is used to change bonding conditions, such as temperature, time, and a pressurizing force, in order to bond copper to each other, and then the bonding strength is measured and a cross sectional structure of bonding is observed, which are described in "Bonding Process Using Silver Nano Particles: Study of Bonding Properties to Cu" by Eiichi Ide, Shinji Angata, Akio Hirose, and Kojiro F. Kobayashi. Proc. 10$^{th}$ Sympo. on Microjoining and Assembly Technologies for Electronics, 2004, Yokohama Japan, (2004) 213.

A bonding principle of the metal nano particles will be described. In general, as a diameter of particles is decreased, the particles have more active surface state than that of bulk metal. Thus, the particles are mutually sintered to grow, and the reaction easily proceeds to reduce a surface energy. This phenomenon occurs especially in nano particles (generally, particles have a diameter of 100 nm or less), as described in "Ph. Buffat and J-P Borel, Phys. Rev. A 13 (6) 2287 (1976)".

By exploiting this phenomenon, it is capable of bonding at far lower temperature than a melting point in a bulk state, and furthermore, a bonding layer after bonding is achieved will not melt again up to the melting point of bulk. A surface of particles actually used for bonding is protected by an organic protective film to suppress sintering, and the protective film is decomposed and degassed by heating during bonding, to thereby achieve bonding.

To easily use the metal nano particles with the organic protective film as mentioned above and to prevent them from oxidation during decomposition, they are dispersed in the organic solvent to reduce viscosity. The solvent including the metal is referred to as a metal nanopaste.

Japanese Patent Application Laid-Open No. 2006-202586 proposes a bonding method which allows for an increase in a bonding area by forming a concave portion in a bonding part of one of members and forming a convex portion in a bonding part of the other member.

The bonding method using sinterability of metal nano particles needs pressurization to obtain high reliability, which is described in Japanese Patent Application Laid-Open No. 2004-107728 and Ide et al., 2004. To perform pressurization, members having the metal nano particles interposed therebetween need to resist pressurization. However, when the members cannot resist pressurizing force, a chip crack and a substrate crack may occur in a semiconductor and an insulating substrate.

To reduce pressurizing force, it is conceivable that the bonding method in Japanese Patent Application Laid-Open No. 2006-202586 is employed. However, in this bonding method, when the metal nano particles do not reach to all of the concave portions in the bonding parts of the members, a bonding strength and a bonding reliability may be decreased.

SUMMARY OF THE INVENTION

It is an object of the present invention to provide a technique capable of improving a bonding strength and a bonding reliability in a case of bonding two members.

A bonding structure including metal nano particles according to the present invention includes a first member having a metal surface on at least one side, a second member having a metal surface on at least one side, the second member being disposed such that the metal surface of the second member faces the metal surface of the first member, and a bonding material bonding the first member and the second member by sinter-bonding the metal nano particles. At least one of the metal surfaces of the first member and the second member is formed to be a rough surface having a surface roughness of 0.5 μm to 2.0 μm.

A bonding method using metal nano particles according to the present invention bonds a first member having a metal surface on at least one side and a second member having a metal surface on at least one side. The bonding method using metal nano particles includes the steps of (a) forming a rough surface having a surface roughness of 0.5 μm to 2.0 μm on at least one of the metal surfaces of the first member and the second member, (b) printing a metal nanopaste on the metal surface of the second member at a constant thickness, (c) mounting the first member on the metal nanopaste printed on the second member, and (d) heating the metal nanopaste printed on the second member with the first member being mounted thereon to sinter-bond the metal nano particles included in the metal nanopaste.

According to the present invention, at least one of the metal surfaces of the first member and the second member is formed to be the rough surface having the surface roughness, so that without increasing the first member and the second member in size, the bonding area of the first member and the second member can be increased. In addition, the sufficient bonding strength can be obtained based on an anchoring effect. The rough surface is formed to have the surface roughness of 0.5 μm to 2.0 μm, and thus a crack area ratio (peeling area ratio) can be greatly suppressed and the bonding reliability in the case of bonding the first member and the second member can be improved.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A first preferred embodiment of the present invention will be described with reference to the diagrams.

Description of Configuration

Figure 1:
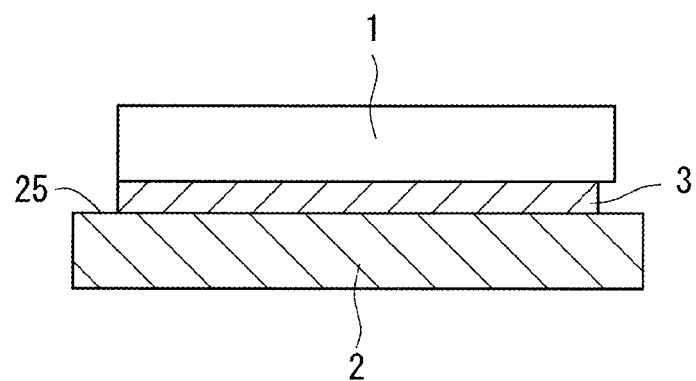
FIG. 1 is a cross sectional view of a bonding structure according to a first preferred embodiment.

FIG. 1 is a cross sectional view showing a bonding structure according to the first preferred embodiment of the present invention. As shown in FIG. 1, the bonding structure includes a first member 1, a second member 2, and a bonding material 3. The first member 1 is made of a conductive metal. The second member 2 is made of a conductive metal and disposed to face the first member 1. The bonding material 3 is assembly obtained by sintering metal nano particles and is interposed between the first member 1 and the second member 2. On a surface of the second member 2, a first roughness region 25 being a rough surface is formed. The details about the first roughness region 25 will be described later.

Figure 2:
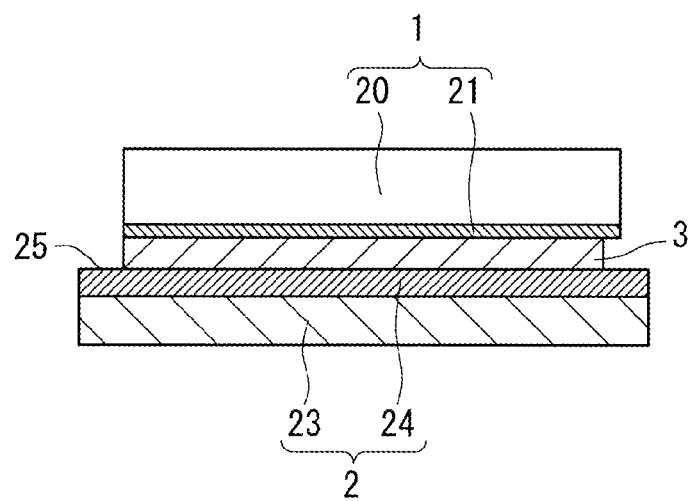
FIG. 2 is a cross sectional view showing a practical example of the bonding structure according to the first preferred embodiment.
Figure 3:
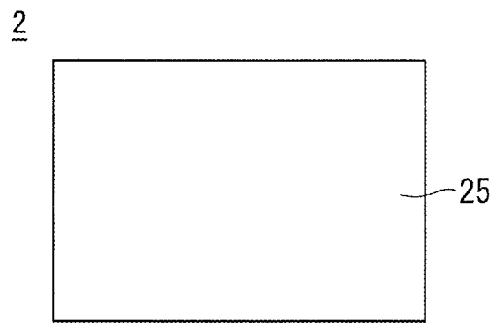
FIG. 3 is a plan view of a second member.

Next, a practical example of the bonding structure will be described. FIG. 2 is a cross sectional view showing the practical example of the bonding structure according to the first preferred embodiment and FIG. 2 is the practical example of the bonding structure in FIG. 1. FIG. 3 is a plan view of the second member 2. FIG. 1 shows the bonding structure in which the first member 1 and the second member 2 are each made of a single metal. On the other hand, FIG. 2 shows the bonding structure in which an interface between the metal nano particles is formed of metal layers 21 and 24.

As shown in FIG. 2, the bonding structure includes the first member 1, the second member 2, and the bonding material 3. The first member 1 is a semiconductor element and includes a semiconductor body 20 and the metal layer 21. The metal layer 21 is disposed on the side of the second member 2 (one surface side of the first member 1) of the semiconductor body 20. In other words, one side of the first member 1 has a surface of the metal layer 21 (metal surface).

The semiconductor body 20 is, for example, Si or SiC. On a back surface of the metal layer 21 (surface on the side of the semiconductor body 20), a titanium layer is formed for forming an ohmic junction, and on an outermost surface of the metal layer 21 (surface on the side of the second member 2), a gold layer which is resistant to oxidizing and has excellent bonding properties to silver is formed. A nickel layer for preventing dissimilar metals from diffusing is formed between the titanium layer and the gold layer.

The bonding material 3 is a sintered compact made of metal particles (for example, silver particles) having an average diameter of 100 nm or less. The second member 2 is a heat spreader and includes a heat spreader body 23 made of copper and the metal layer 24. The metal layer 24 is disposed on the side of the first member 1 (one surface side of the second member 2) of the heat spreader body 23. In other words, one side of the second member 2 has a surface of the metal layer 24 (metal surface).

As shown in FIGS. 2 and 3, the surface of metal layer 24 (surface on the side of the first member 1) is a bonding surface to the first member 1, and the first roughness region 25 being a rough surface is formed on the whole surface of the metal layer 24. The first roughness region 25 is formed to be the rough surface having a predetermined surface roughness within a range of a surface roughness Rz-JIS from 0.5 μm to less than 2.0 μm.

Figure 4:
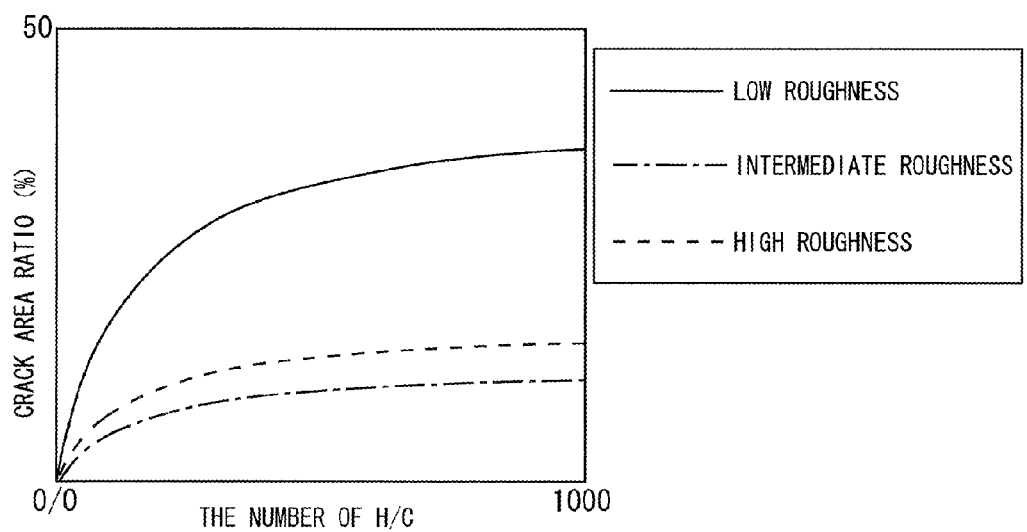
FIG. 4 is a comparative diagram showing test results on reliability in a case of changing surface roughness of a bonding surface of the second member.

The reason why the surface roughness is formed within the range as mentioned above will be described. FIG. 4 is a comparative diagram showing test results on reliability in a case of changing the surface roughness of the bonding surface of the second member 2. In FIG. 4, a vertical axis indicates a crack area ratio (peeling area ratio) and a horizontal axis indicates the number of cycles of H/C cycle. Low roughness has surface roughness from 0.3 μm to less than 0.5 μm. Intermediate roughness has surface roughness from 0.5 μm to less than 2.0 μm. High roughness has surface roughness from 2.0 μm to less than 3.7 μm. As shown in FIG. 4, the intermediate roughness has the minimum crack area ratio and the maximum bonding reliability. Thus, the first roughness region 25 is formed to have the predetermined surface roughness within the range from 0.5 μm to less than 2.0 μm.

A bonding surface of the second member 2 is formed greater than that of the first member 1, and the rough surface of the second member 2 is formed on the whole bonding surface of the second member 2 (surface of the metal layer 24). Thus, the rough surface of the second member 2 is formed in a region greater than the bonding region in the second member 2 bonded to the bonding surface of the first member 1.

Bonding Method

Figure 5:
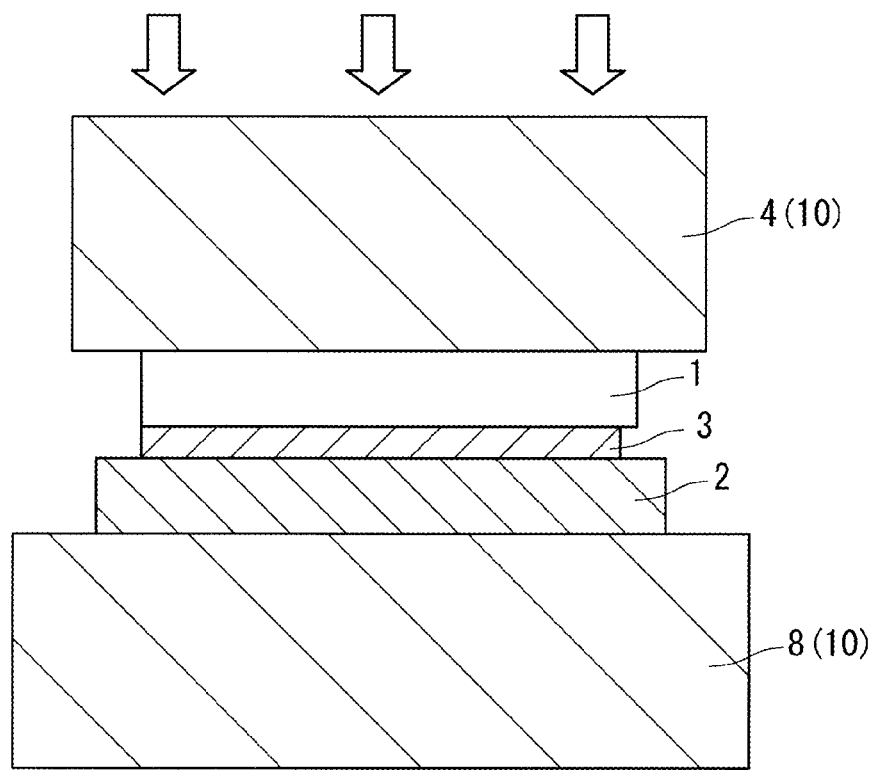
FIG. 5 is a cross sectional view showing the bonding structure in FIG. 1 being manufactured in progress.

Next, a bonding structure and a bonding method used for a test on reliability in FIG. 4 will be described. FIG. 5 is a cross sectional view showing the bonding structure in FIG. 1 being manufactured in progress.

FIG. 2 shows a state in which the bonding structure is completed. Si is used as the semiconductor body 20 of the first member 1, and gold is used for the outermost surface of the metal layer 21. The heat spreader body 23 of the second member 2 is made of copper. For the surface roughness of the metal layer 24, three types of the second member 2, which have low roughness, intermediate roughness, and high roughness, are prepared, and the surface roughness is the same on the whole surface of the metal layer 24.

The first roughness region 25 of the metal layer 24 is formed with a use of a sand paper and a file. The first roughness region 25 may also be formed by milling, grinding, electric discharge, polishing, or scientific technique (etching).

A metal nanopaste, in which the metal nano particles coated with an organic protective film is dispersed in an organic solvent in a preliminary step of forming the bonding material 3 being the sintered compact for the metal nano particles, is prepared between the first member 1 and the second member 2. In this test, a metal of the metal nano particles is silver.

Next, the members as mentioned above are used for bonding. First, the metal nanopaste having the same size as the bonding surface of the semiconductor element being the first member 1 is printed on the heat spreader made of copper being the second member 2 at a constant thickness by the screen printing method. Next, the first member 1 is mounted on the metal nanopaste printed on the second member 2.

After that, as shown in FIG. 5, the first member 1 mounted on the metal nanopaste printed on the second member 2 is set to a heating and pressurizing device 10. The heating and pressurizing device 10 includes a fixing section 8 and a pressing section 4. The heating and pressurizing device 10 places an object to be bonded between the fixing section 8 and the pressing section 4, and it applies pressure to the object to be bonded with the fixing section 8 and the pressing section 4 while heating the object.

The first member 1 mounted on the metal nanopaste printed on the second member 2 is placed between the fixing section 8 and the pressing section 4, and the fixing section 8 and pressing section 4 apply pressure to the first member 1 and the second member 2 while heating them. The first member 1 and the second member 2 are pressurized and heated, so that an organic component included in the metal nanopaste is decomposed and vaporized, whereby the metal nano particles are sinter-bonded. As a result, the bonding structure as shown in FIG. 2 is completed.

Effects

In general, bonding between metals is easier for similar metals than for dissimilar metals. A bonding principle of the metal nano particles exploits a bonding energy from a surface of particles, and an absolute contact area for the dissimilar metals of the metal nano particles is increased due to the reason above, whereby a peeling at an interface between the dissimilar metals can be prevented to occur. Adjusting the surface roughness allows for an increase in the contact area. Consequently, bonding with low peeling rate at an interface and with high reliability can be achieved. Moreover, a bonding technique using the micro metal paste is established, so that the bonding structure having a high quality with high reliability can be obtained.

As described above, in the bonding structure according to the first preferred embodiment, at least one of the metal surfaces of the first member 1 and the second member 2 is formed to be the rough surface, so that without increasing the first member 1 and the second member 2 in size, the bonding area of the first member 1 and the second member 2 can be increased. In addition, a sufficient bonding strength can be obtained based on an anchoring effect.

Furthermore, the first roughness region 25 being the rough surface is formed to have the predetermined surface roughness within the range from 0.5 µm to less than 2.0 µm, so that as described with reference to FIG. 4, the crack area ratio can be greatly suppressed and the bonding reliability in the case of bonding the first member 1 and the second member 2 can be improved. Thus, the structure, in which the first member 1 and the second member 2 are bonded, allows for an improvement in endurance and yield. Moreover, providing the rough surface for the bonding surface ensures the bonding area having the minimum required area, whereby the bonding structure can be reduced in size.

The rough surface of the second member 2 is formed in a region greater than the bonding region in the second member 2 bonded to the bonding surface of the first member 1, so that the organic solvent included in the metal nanopaste can be more easily decomposed and vaporized through the region except for the bonding region of the rough surface of the second member 2 in particular.

The first member 1 is the semiconductor element and the second member 2 is the heat spreader, and thus the bonding structure according to the first preferred embodiment which can obtain the sufficient bonding strength and high bonding reliability is used, whereby great effects can be exerted. Furthermore, in a case where the semiconductor element is SiC, it is used at high temperatures, whereby greater effects can be exerted.

The bonding method using the metal nano particles includes steps of (a) forming the first roughness region 25 which is the rough surface having the predetermined surface roughness within the range from 0.5 µm to less than 2.0 µm on at least one of the metal surfaces of the first member 1 and the second member 2, (b) printing the metal nanopaste on the metal surface of the second member 2 at a constant thickness, (c) mounting the first member 1 on the metal nanopaste printed on the second member 2, and (d) heating the metal nanopaste printed on the second member 2 with the first member being mounted thereon to sinter-bond the metal nano particles included in the metal nanopaste.

Therefore, at least one of the metal surfaces of the first member 1 and the second member 2 is formed to be the rough surface, so that without increasing the first member 1 and the second member 2 in size, the bonding area of the first member 1 and the second member 2 can be increased. In addition, the sufficient bonding strength can be obtained based on the anchoring effect.

Moreover, the rough surface having the predetermined surface roughness within the range from 0.5 µm to less than 2.0 µm is formed to be at least one of the metal surfaces of the first member 1 and the second member 2, so that the crack area ratio can be greatly suppressed and the bonding reliability in the case of bonding the first member 1 and the second member 2 can be improved.

The bonding method, in which the bonding area is increased by forming the concave portion in the bonding part of the members and forming the convex portion in the bonding part of the other member, has been proposed. On the contrary, the bonding method according to the present preferred embodiment can be easily performed without increasing the number of steps simply by replacing the step of forming the concave portion and the convex portion with the step (a).

Second Preferred Embodiment

Figure 6:
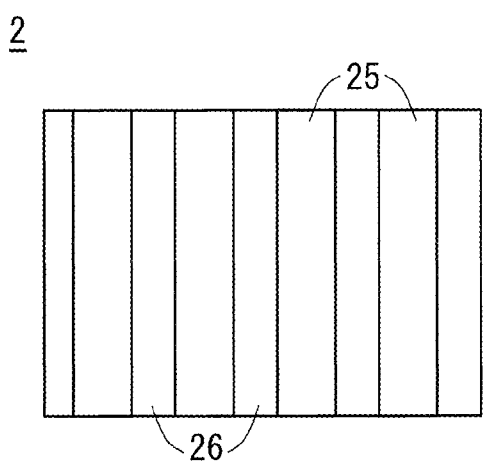
FIG. 6 is a plan view of the second member in a bonding structure according to a second preferred embodiment.

Next, a bonding structure according to a second preferred embodiment will be described. FIG. 6 is a plan view showing the second member 2 in the bonding structure according to the second preferred embodiment. In the second preferred embodiment, the same components as those described in the first preferred embodiment are denoted by the same references, which are not described here.

In the first preferred embodiment, as shown in FIG. 3, the surface roughness is the same on the whole bonding surface of the second member 2. In the present preferred embodiment, as shown in FIG. 6, a rough surface includes the first roughness region 25 and a second roughness region 26 which are formed in straight stripes in parallel with each other.

The first roughness region 25 is formed to have the predetermined surface roughness (the first surface roughness) within the range of the surface roughness Rz-JIS from 0.5 µm to less than 2.0 µm. The second roughness region 26 is formed to have the predetermined surface roughness (the second surface roughness) greater than the surface roughness of the first roughness region 25 within the range of the surface roughness Rz-JIS from 0.5 µm to less than 2.0 µm.

In other words, the first roughness region 25 and the second roughness region 26 having different surface roughness are formed in straight stripes in parallel with each other to provide the surface roughness with directionality. However, the surface roughness is in a direction in which the second roughness region 26 having stripe shapes extends.

The second roughness region 26 of the metal layer 24 is formed with a use of a sand paper or a file. The second roughness region 26 may also be formed by milling, grinding, electric discharge, polishing, or scientific technique (etching).

As described above, in the bonding structure according to the second preferred embodiment, the rough surface includes the first roughness region 25 having the surface roughness as the first surface roughness and the second roughness region 26 having the surface roughness as the second surface roughness greater than the first surface roughness, so that the surface roughness varies on the bonding surface on the same plane in the second member 2, whereby a sufficient bonding strength can be obtained. Moreover, the first roughness region 25 and the second roughness region 26 are formed in the straight shapes in parallel with each other to provide the surface roughness with directionality, and thus the organic solvent included in the metal nanopaste can be easily decomposed and vaporized through the second roughness region 26, whereby the generation of a void which is a factor in deterioration of bonding quality and a bonding reliability can be suppressed.

As described in the first preferred embodiment, the rough surface of the second member 2 is formed in a region greater than the bonding region in the second member 2 bonded to the bonding surface of the first member 1, so that the organic solvent included in the metal nanopaste can be more easily decomposed and vaporized through the second roughness region 26 except for the bonding region of the rough surface of the second member 2 in particular.

Third Preferred Embodiment

Figure 7:
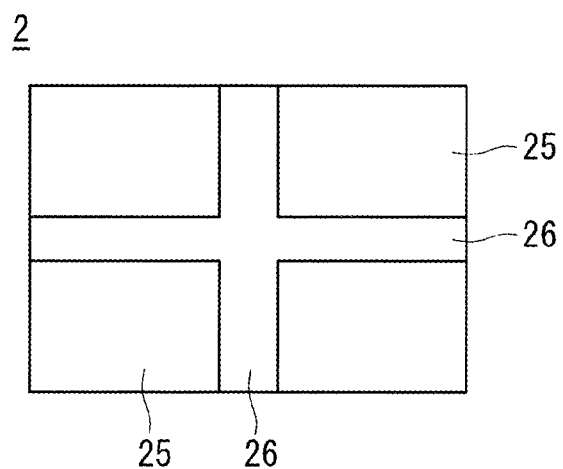
FIG. 7 is a plan view of the second member in a bonding structure according to a third preferred embodiment.

Next, a bonding structure according to a third preferred embodiment will be described. FIG. 7 is a plan view showing the second member 2 in the bonding structure according to the third preferred embodiment. In the third preferred embodiment, the same components as those described in the first and second preferred embodiments are denoted by the same references, which are not described here.

In the first preferred embodiment, as shown in FIG. 3, the surface roughness is the same on the whole bonding surface of the second member 2. On the contrary, in the present preferred embodiment, as shown in FIG. 7, the rough surface includes the first roughness region 25 and the second roughness region 26, and the second roughness region 26 is formed into a cross shape.

The first roughness region 25 is formed to have the predetermined surface roughness (the first surface roughness) within the range of the surface roughness Rz-JIS from 0.5 µm to less than 2.0 µm. The first roughness region 25 is formed in a region except for the second roughness region 26 having the cross shape of the bonding surface of the second member 2. The second roughness region 26 is formed to have the predetermined surface roughness (the second surface roughness) greater than that of the first roughness region 25 within the range of the surface roughness Rz-JIS from 0.5 µm to less than 2.0 µm.

In other words, the second roughness region 26 having the surface roughness greater than that of the first roughness region 25 is formed into the cross shape to provide the surface roughness with directionality. However, the surface roughness is in a direction in which the second roughness region 26 having the cross shape extends.

As described above, in the bonding structure according to the third preferred embodiment, the rough surface includes the first roughness region 25 having the surface roughness as the first surface roughness and the second roughness region 26 having the surface roughness as the second surface roughness greater than the first surface roughness, and the second roughness region 26 is formed into the cross shape.

Therefore, the surface roughness is provided with the directionality, and thus the organic solvent included in the metal nanopaste can be more easily decomposed and vaporized through the second roughness region 26 having the cross shape in all directions, whereby the generation of a void which is a factor in deterioration of bonding quality and a bonding reliability can be suppressed more.

As described in the first preferred embodiment, the rough surface of the second member 2 is formed in a region greater than the bonding region in the second member 2 bonded to the bonding surface of the first member 1, so that the organic solvent included in the metal nanopaste can be more easily decomposed and vaporized through the second roughness region 26 except for the bonding region of the rough surface of the second member 2 in particular.

Fourth Preferred Embodiment

Figure 8:
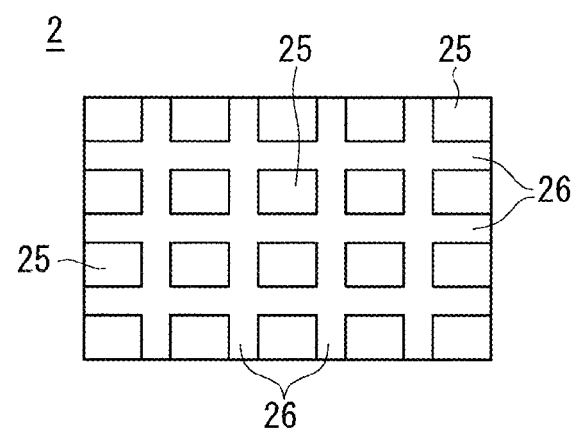
FIG. 8 is a plan view of the second member in a bonding structure according to a fourth preferred embodiment.

Next, a bonding structure according to a fourth preferred embodiment will be described. FIG. 8 is a plan view showing the second member 2 in the bonding structure according to the fourth preferred embodiment. In the fourth preferred embodiment, the same components as those described in the first to third preferred embodiments are denoted by the same references, which are not described here.

In the first preferred embodiment, as shown in FIG. 3, the surface roughness is the same on the whole bonding surface of the second member 2. On the contrary, in the present preferred embodiment, as shown in FIG. 8, the rough surface includes the first roughness region 25 and the second roughness region 26, and the second roughness region 26 is formed in a grid pattern.

The first roughness region 25 is formed to have the predetermined surface roughness (the first surface roughness) within the range of the surface roughness Rz-JIS from 0.5 µm to less than 2.0 µm. The first roughness region 25 is formed in a region except for the second roughness region 26 formed in the grid pattern of the bonding surface of the metal layer 24. The second roughness region 26 is formed to have the predetermined surface roughness (the second surface roughness) greater than that of the first roughness region 25 within the range of the surface roughness Rz-JIS from 0.5 µm to less than 2.0 µm.

In other words, the second roughness region 26 having the surface roughness greater than that of the first roughness region 25 is formed in the grid pattern to provide the surface roughness with directionality. However, the surface roughness is in a direction in which the second roughness region 26 formed in the grid pattern extends.

As described above, in the bonding structure according to the fourth preferred embodiment, the rough surface includes the first roughness region 25 having the surface roughness which is the first surface roughness and the second roughness region 26 having the surface roughness in which the second surface roughness is greater than the first surface roughness, and the second roughness region 26 is formed in the grid pattern.

Therefore, the surface roughness is provided with the directionality, and thus the organic solvent included in the metal nanopaste can be more easily decomposed and vaporized through the second roughness region 26 having the cross shape in all directions, whereby the generation of a void which is a factor in deterioration of bonding quality and a bonding reliability can be suppressed more.

As described in the first preferred embodiment, the rough surface of the second member 2 is formed in a region greater than the bonding region in the second member 2 bonded to the bonding surface of the first member 1, so that the organic solvent included in the metal nanopaste can be more easily decomposed and vaporized through the second roughness region 26 except for the bonding region of the rough surface of the second member 2 in particular.

In the first to fourth preferred embodiments, the case where the first member 1 is the semiconductor element and the second member 2 is the heat spreader is described, and it is not limited to this case and members other than these may be used. Moreover, the first member 1 disposes the metal layers on both sides, and the metal surfaces may be formed on both sides of the first member 1. The second member 2 disposes the metal layers on both sides, and the metal surfaces may be formed on both sides of the second member 2.

In the first to fourth preferred embodiments, the case where the metal surface of the second member 2 is formed to be the rough surface, and it is not limited to this and the metal surface of the first member 1 may be formed to be the rough surface. Furthermore, the metal surface of the first member 1 and the metal surface of the second member 2 may be each formed to be the rough surface.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A bonding structure including metal nano particles, comprising:
   a first member having a metal surface on at least one side;
   a second member having a metal surface on at least one side, said second member being disposed such that said metal surface of said second member faces said metal surface of said first member; and
   a bonding material bonding said first member and said second member by sinter-bonding the metal nano particles,
   wherein at least one of said metal surfaces of said first member and said second member is formed to be a rough surface having a surface roughness of 0.5 µm Rz-JIS to 2.0 µm Rz-JIS.

2. The bonding structure including metal nano particles according to claim 1, wherein
   said rough surface includes a first roughness region having a first surface roughness and a second roughness region having a second surface roughness greater than said first surface roughness, and
   said first roughness region and said second roughness region are formed in straight stripes in parallel with each other.

3. The bonding structure including metal nano particles according to claim 1, wherein
   said rough surface includes a first roughness region having a first surface roughness and a second roughness region having a second surface roughness greater than said first surface roughness, and
   said second roughness region is formed in a cross shape or in a grid pattern.

4. The bonding structure including metal nano particles according to claim 1, wherein said rough surface is formed in a region greater than a bonding region to an opposite metal surface in at least one of said metal surfaces of said first member and said second member.

5. The bonding structure including metal nano particles according to claim 1, wherein said first member is a semiconductor element and said second member is a heat spreader.

6. The bonding structure including metal nano particles according to claim 5, wherein said semiconductor element is SiC.

7. The bonding structure including metal nano particles according to claim 1, wherein said rough surface has a surface roughness of 0.5 µm Rz-JIS to less than 2.0 µm Rz-JIS.

8. The bonding structure including metal nano particles according to claim 7, wherein said at least one of said metal surfaces of said first member and said second member is roughened to form said rough surface.

\* \* \* \* \*